(12) United States Patent
Boudreaux et al.

(10) Patent No.: US 6,695,042 B1
(45) Date of Patent: Feb. 24, 2004

(54) ADJUSTABLE PEDESTAL THERMAL INTERFACE

(75) Inventors: Brent A. Boudreaux, Highland Village, TX (US); Stacy Fraker, Glen Allen, TX (US); Eric C. Peterson, McKinney, TX (US); Christian L. Belady, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 137 days.

(21) Appl. No.: 10/209,981

(22) Filed: Jul. 31, 2002

(51) Int. Cl.[7] .............................................. F28D 15/00
(52) U.S. Cl. ........................ 165/104.33; 165/104.21; 165/80.3; 361/697; 361/704; 257/707; 174/16.3
(58) Field of Search ............................. 165/185, 80.3, 165/104.33, 104.21; 361/709, 697, 704, 710; 257/707, 718, 719, 720, 726, 727; 174/16.3

(56) References Cited

U.S. PATENT DOCUMENTS

| | | | | | |
|---|---|---|---|---|---|
| 2,993,153 | A | * | 7/1961 | Wagner | 257/720 |
| 3,170,098 | A | * | 2/1965 | Marino | 257/720 |
| 3,313,987 | A | * | 4/1967 | Boyer | 165/185 |
| 3,522,513 | A | * | 8/1970 | Vogt | 257/720 |
| 3,717,523 | A | * | 2/1973 | Dunsche | 257/720 |
| 5,862,038 | A | * | 1/1999 | Suzuki et al. | 361/704 |
| 5,945,736 | A | * | 8/1999 | Rife et al. | 257/719 |
| 6,014,315 | A | * | 1/2000 | McCullough et al. | 361/704 |
| 6,021,045 | A | * | 2/2000 | Johnson | 361/704 |

* cited by examiner

Primary Examiner—Terrell McKinnon
(74) Attorney, Agent, or Firm—Leslie P. Gohman (57) ABSTRACT

A heat sink is constructed including at least one thermally conductive pedestal, allowing configuration of the heat sink to make contact with a plurality of heat-generating electronic devices where the devices may not be co-planar due to tolerance stack-up. The pedestals may be raised and lowered and tilted as needed to match the heights and tilts of the electronic devices. Within the heat sink is a cavity above the pedestal that may be filled with a thermally conductive material, such as solder, or a thermally conductive liquid, during construction to create a low thermal resistance contact between the pedestal and the heat sink fins. Also, thermally conductive material, such as thermal paste or a thermal pad, may be used between the heat generating device and the pedestal to create a low thermal resistance contact.

35 Claims, 6 Drawing Sheets

ADJUSTABLE PEDESTAL THERMAL INTERFACE

FIELD OF THE INVENTION

The present invention relates generally to the field of heat sinks and more specifically to the field of heat sinks configured to maximize thermal conduction with heat generating devices that may not be co-planar with the heat sink.

BACKGROUND OF THE INVENTION

Modern electronics have benefited from the ability to fabricate devices on a smaller and smaller scale. As the ability to shrink devices has improved, so has their performance. Unfortunately, this improvement in performance is accompanied by an increase in power as well as power density in devices. In order to maintain the reliability of these devices, the industry must find new methods to remove this heat efficiently.

By definition, heat sinking means that one attaches a cooling device to a heat-generating component and thereby removes the heat to some cooling medium, such as air or water. Unfortunately, one of the major problems in joining two devices to transfer heat through a common surface is that a thermal interface is created at the junction. This thermal interface is characterized by a thermal contact impedance. Thermal contact impedance is a function of contact pressure, surface finish, and gap size.

As the power density of electronic devices increases, heat transfer from the heat generating devices to the surrounding environment becomes more and more critical to the proper operation of the devices. Many current electronic devices incorporate heat sink fins to dissipate heat to the surrounding air moving over the fins. These heat sinks are thermally connected to the electronic devices by a variety of techniques. Some devices use a thermally conductive paste in an attempt to lower the contact resistance. Others may use solder between the two elements both for mechanical strength and thermal conductance. However, these two solutions require additional cost and process steps that would not be necessary except for presence of the contact resistance.

Many present electronic modules include a plurality of heat-generating electronic devices on a single substrate. Often these devices to not have a co-planer upper surface which would allow a single heat sink to be thermally coupled to the plurality of devices. Thermal paste and other thermally conductive materials may be used to fill any gaps between the heat-generating electronic devices and the single heat sink, however large gaps, caused by tolerance stack-up issues between the heat-generating devices, are often not capable of being filled by a paste. Thermal gap pads are capable of filling gaps on the order of 20 to 200 mils, however, they have relatively low thermal conductivity, and may not be usable with high performance devices that generate large amounts of heat. In such cases, multiple heat sinks may be used, however, this adds cost and reduces the efficiency of the heat dissipation.

SUMMARY OF THE INVENTION

A heat sink is constructed including at least one thermally conductive pedestal, allowing configuration of the heat sink to make contact with a plurality of heat-generating electronic devices where the devices may not be co-planar due to tolerance stack-up. The pedestals may be raised and lowered and tilted as needed to match the heights and tilts of the electronic devices. Within the heat sink is a cavity above the pedestal that may be filled with a thermally conductive material, such as solder, or a thermally conductive liquid, during construction to create a low thermal resistance contact between the pedestal and the heat sink fins. Also, thermally conductive material, such as thermal paste or a thermal pad, may be used between the heat generating device and the pedestal to create a low thermal resistance contact.

Other aspects and advantages of the present invention will become apparent from the following detailed description, taken in conjunction with the accompanying drawings, illustrating by way of example the principles of the invention.

DETAILED DESCRIPTION

Figure 1:
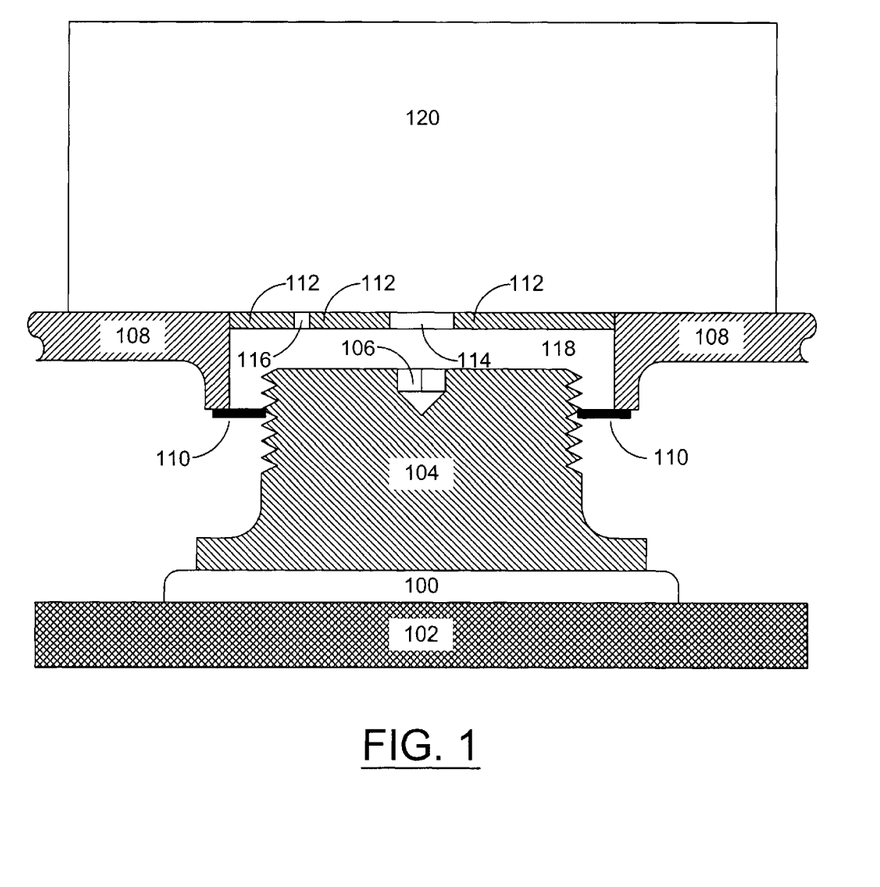
FIG. 1 is a cross-sectional view of an example embodiment of a heat sink according to the present invention.
Figure 2:
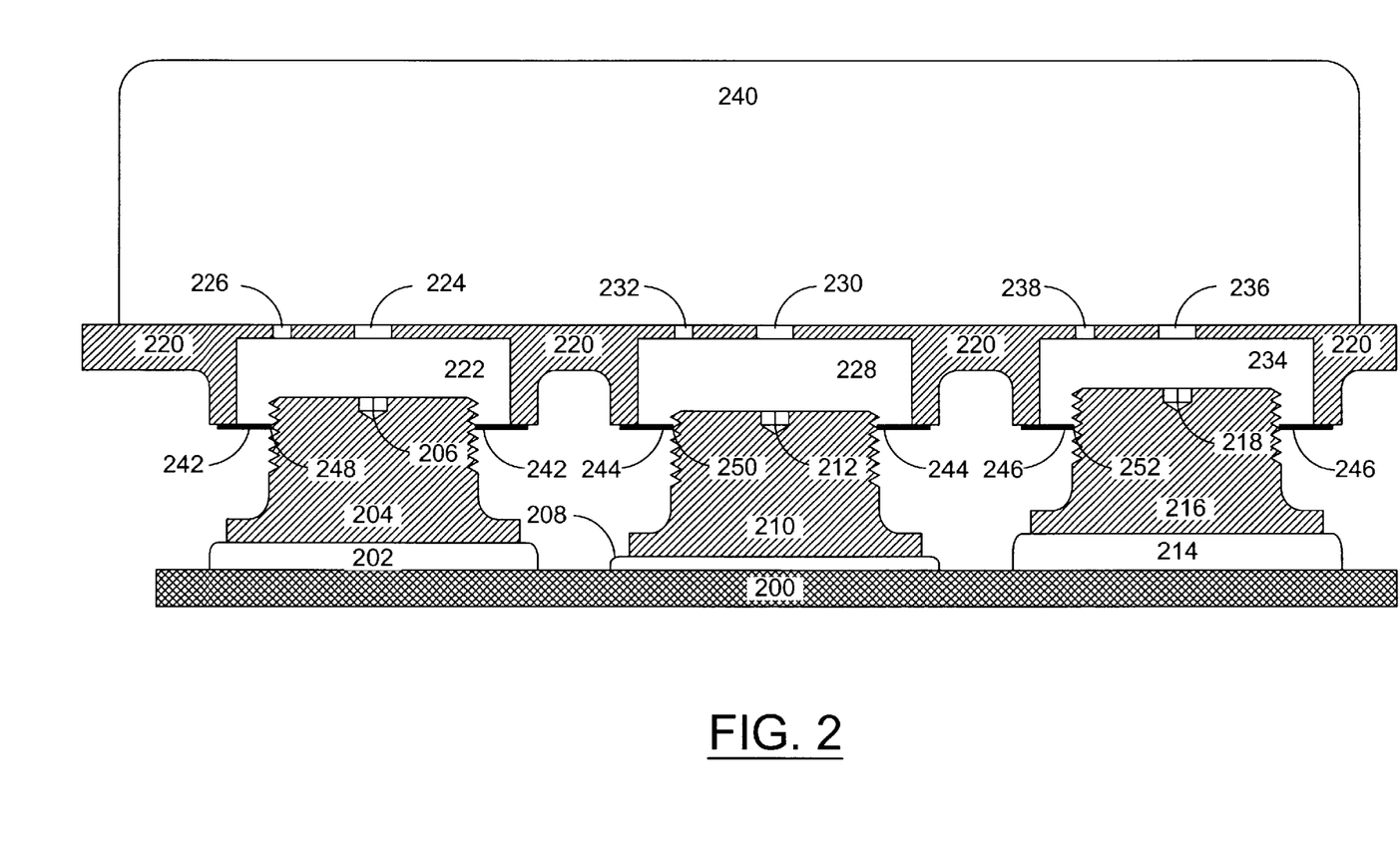
FIG. 2 is a cross-sectional view of an example embodiment of a heat sink including three threaded pedestals according to the present invention.

FIG. 1 is a cross-sectional view of an example embodiment of a heat sink according to the present invention. A heat-generating electronic device 100 is attached to a substrate 102. A thermally conductive threaded pedestal 104 is thermally coupled with the electronic device 100 on a side opposite to that of the substrate 102. A heat sink including a heat sink base 108, a plate 112, fins 120 and a thin plate 110 is attached to the threaded pedestal 104. Note that in some embodiments of the present invention, the heat sink base 108, plate 112, and fins 120 may all be constructed as integral parts of a heat sink, instead of being constructed separately and assembled into a heat sink. In some embodiments of the present invention, the thin plate 110 will be configured such that the threaded pedestal 104 may be threaded into it at a small angle to match a tilt in the upper surface of the heat-generating electronic device 100. Note that the threads shown in FIG. 1 are exaggerated in size for purposes of illustration. Many embodiments of the present invention will use threads proportionally smaller than those shown in this figure. In some embodiments of the present invention the plate 112 may be formed as a contiguous portion of the heat sink base 108, as shown in FIG. 2. Other embodiments of the present invention may construct the plate 112 separately from the heat sink base 108 and physically connect them together to form a surface for the attachment of the heat sink fins 120, as shown in FIG. 1. The plate 112 includes a drive access hole 114 and a solder overflow vent 116. The threaded pedestal 104 includes a drive socket 106.

FIG. 2 is a cross-sectional view of an example embodiment of a heat sink including three threaded pedestals according to the present invention. In an example embodiment of the present invention, a plurality of thermally conductive threaded pedestals may be used with a single heat sink, allowing heat dissipation from a plurality of heat-generating electronic devices with non-co-planar upper surfaces. In the example embodiment of the present invention shown in FIG. 2 three heat-generating electrical devices with different heights are thermally coupled with a single heat sink body 220 and a single set of heat sink fins 240. A first heat-generating electrical device 202 having a first height is attached to a substrate 200, along with a second heat-generating electrical device 208 having a second height and a third heat-generating electrical device 214 having a third height. The first, second, and third heights may all be different as shown in the example embodiment of the present invention of FIG. 2. A heat sink body 220 is constructed including a first solder cavity 222, a second solder cavity 228, and a third solder cavity 234. A first thin plate 242 including an opening 248 sized to fit a first pedestal 204 is attached to the heat sink body 220 under the first solder cavity 222. A second thin plate 244 including an opening 250 sized to fit a second pedestal 210 is attached to the heat sink body 220 under the second solder cavity 228. A third thin plate 246 including an opening 252 sized to fit a third pedestal 216 is attached to the heat sink body 220 under the third solder cavity 234. A first solder overflow vent 226 and a first drive access hole 224 are included in the portion of the heat sink body 220 above the first solder cavity 222. A second solder overflow vent 232 and a second drive access hole 230 are included in the portion of the heat sink body 220 above the second solder cavity 228. A third solder overflow vent 238 and a third drive access hole 236 are included in the portion of the heat sink body 220 above the third solder cavity 234. A first threaded pedestal 204 including a first drive socket 206, a second threaded pedestal 210 including a second drive socket 212, and a third threaded pedestal 216 including a third drive socket 218 are provided. In use of the example embodiment of the present invention shown in FIG. 2, the three threaded pedestals 204, 210, and 216 are adjusted by a drive tool through the three drive access holes 224, 230, and 236 to match the differing heights of the three heat-generating electrical devices 202, 208, and 214. Other embodiments of the present invention may not require the use of a drive socket and drive access hole. The threaded pedestals may be threaded into the heat sink to a known depth before the assembled heat sink is placed over the substrate, eliminating the need for a drive socket and drive access hole. A thermally conductive material, such as a solder paste, thermal grease, or a thermal pad, may be applied between the three heat-generating electrical devices 202, 208, and 214 and the three threaded pedestals 204, 210, and 216. The three solder cavities 222, 228, and 236 may be filled with melted solder to create a low resistance thermal connection between the three threaded pedestals 204, 210, and 216 and the heat sink body 220. The three solder cavities 222, 228, and 236 may be filled either before or after the heat sink is mechanically attached to the substrate 200. Upon filling of the three solder cavities 222, 228, and 236 excess solder may escape via the three solder overflow vents 226, 232, and 238. The presence of solder at the three solder overflow vents 226, 232, and 238 may be used as a visual indication that the three solder cavities 222, 228, and 236 are full.

Figure 3:
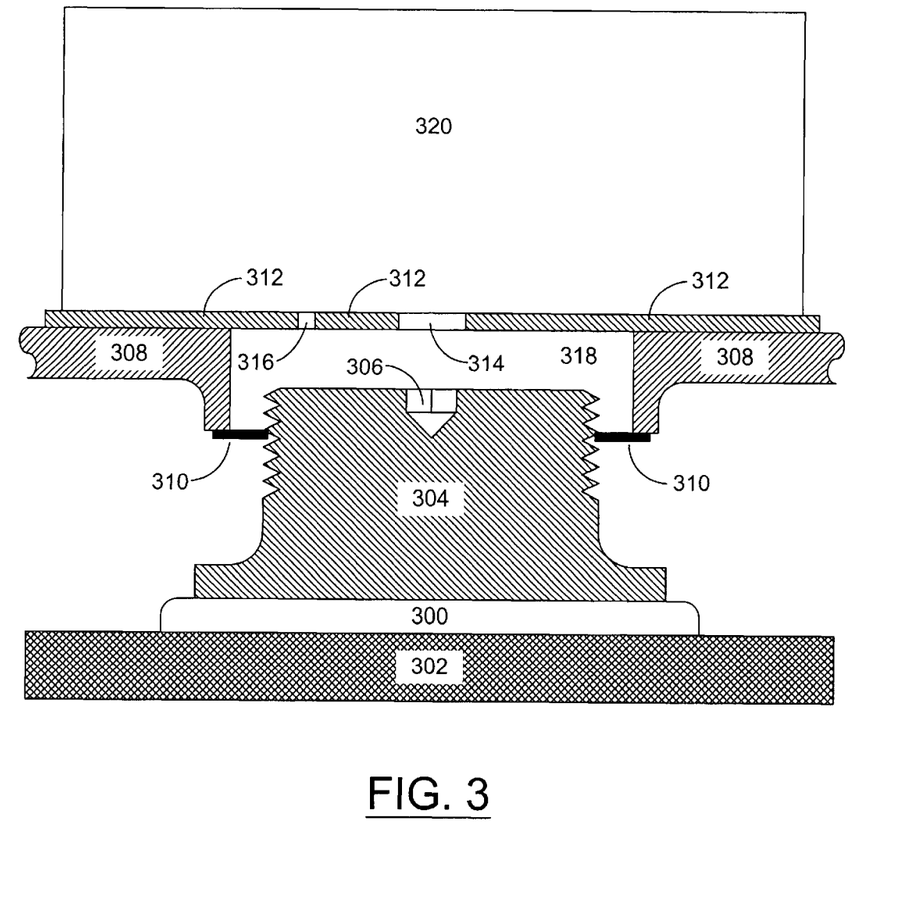
FIG. 3 is a cross-sectional view of an example embodiment of a heat sink according to the present invention.

FIG. 3 is a cross-sectional view of an example embodiment of a heat sink according to the present invention. In some embodiments of the present invention it may be desirable to simplify the heat sink body 308 by attaching a plate 312 between the heat sink body 308 and the heat sink fins 320. Note that in some embodiments of the present invention, the heat sink base 308, plate 312, and fins 320 may all be constructed as integral parts of a heat sink, instead of being constructed separately and assembled into a heat sink. In this embodiment, the solder overflow vent 316 and the drive access hole 314 may be created in the plate 312 instead of into the heat sink body 308. A thin plate 310 is attached to the bottom of the heat sink body 308 below a solder cavity 318. A heat-generating electrical device 300 is attached to a substrate 302 and a thermally conductive threaded pedestal 304 including a drive socket 306 is threaded into the thin plate 310. Other than the addition of the plate 312 this example embodiment of the present invention is similar to that shown in FIG. 1.

Figure 4:
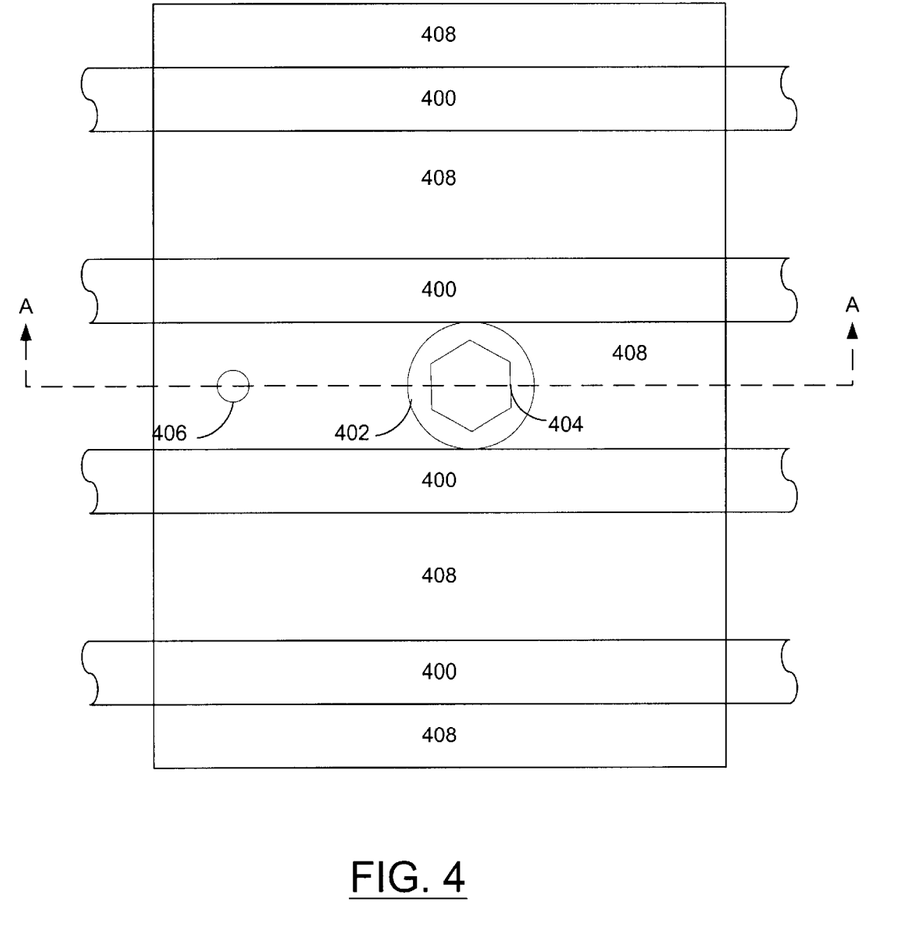
FIG. 4 is a top view of an example embodiment of a heat sink according to the present invention.

FIG. 4 is a top view of an example embodiment of a heat sink according to the present invention. Cross-section A is the cross-section used in FIG. 1 and FIG. 3. Heat sink fins 400 are shown attached to a heat sink body 408, as in the embodiment of the present invention shown in FIG. 2. In the example embodiments of the present invention shown in FIG. 1 and FIG. 3, the heat sink body 408 of FIG. 4 would show instead a plate. A solder overflow vent 406 and a drive access hole 402 are shown in the heat sink body 408. A drive socket 404 may be seen through the drive access hole 402.

Figure 5:
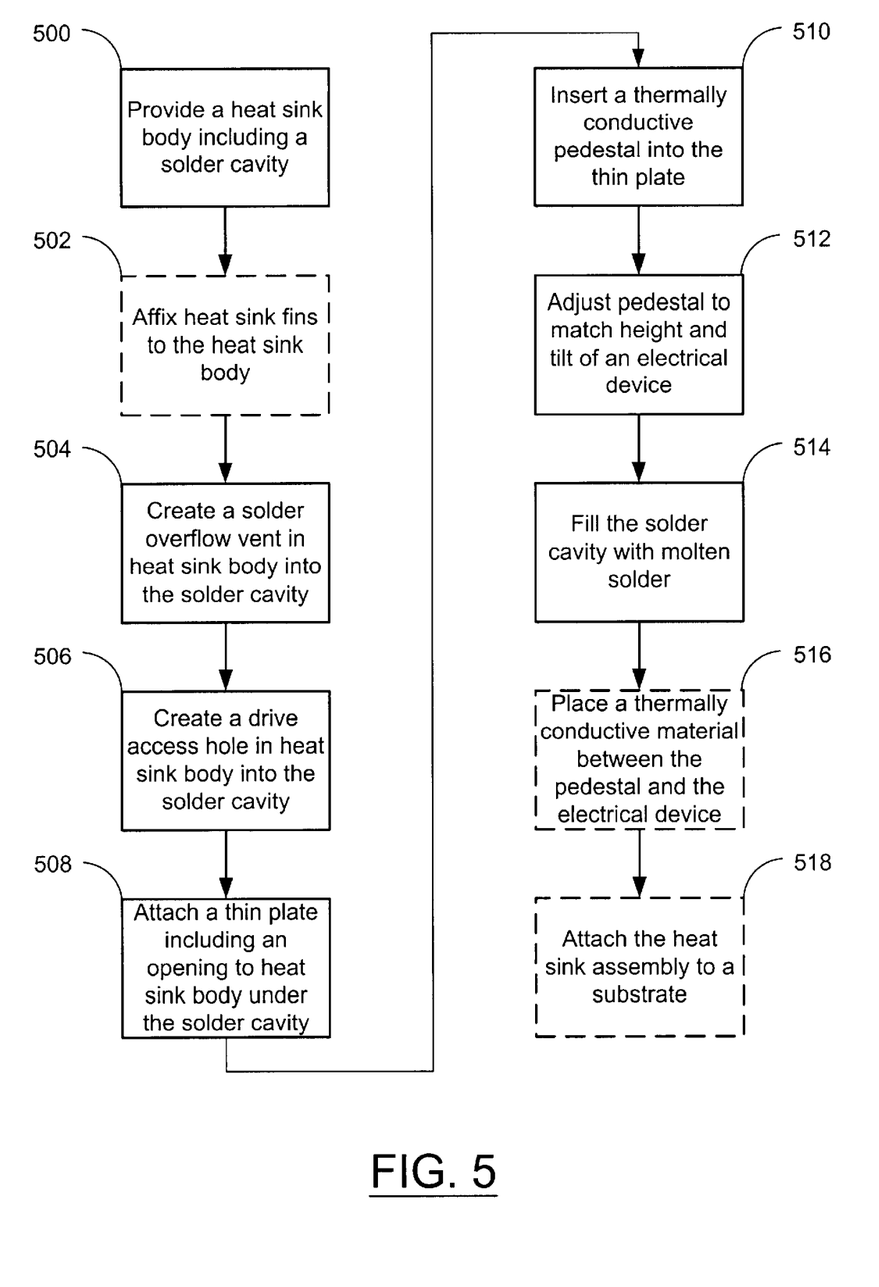
FIG. 5 is a flow chart of an example method of constructing a heat sink according to the present invention.

FIG. 5 is a flow chart of an example method of constructing a heat sink according to the present invention. In a step 500 a heat sink body including a solder cavity is provided. In an optional step 502 heat sink fins are attached to the heat sink body. In other example embodiments of the present invention, heat sink fins may be formed as an integral part of the heat sink body, or may not be needed at all. In a step 504 a solder overflow vent into the solder cavity is formed in the heat sink body. In an optional step 506 a drive access hole into the solder cavity is formed in the heat sink body. In a step 508 a thin plate including an opening sized to fit a thermally conductive pedestal is mechanically attached to the heat sink body under the solder cavity. In a step 510 a thermally conductive pedestal is threaded into the opening in the thin plate. In a step 512 the pedestals are adjusted to correspond to the height of a heat-generating electrical device on a substrate. In a step 514 the solder cavity is filled with molten solder. In an optional step 516 a thermally conductive material, such as a thermal paste is placed between the thermal pedestal and the electrical device. In an optional step 518 the heat sink assembly is mechanically attached to a substrate. Some embodiments of the present invention may not require the heat sink assembly to be mechanically attached to a substrate. They may use other techniques to prevent the heat sink from shifting within the scope of the present invention. Still other embodiments of the present invention may attach the heat sink assembly to a substrate before filling the solder cavity with molten solder.

Figure 6:
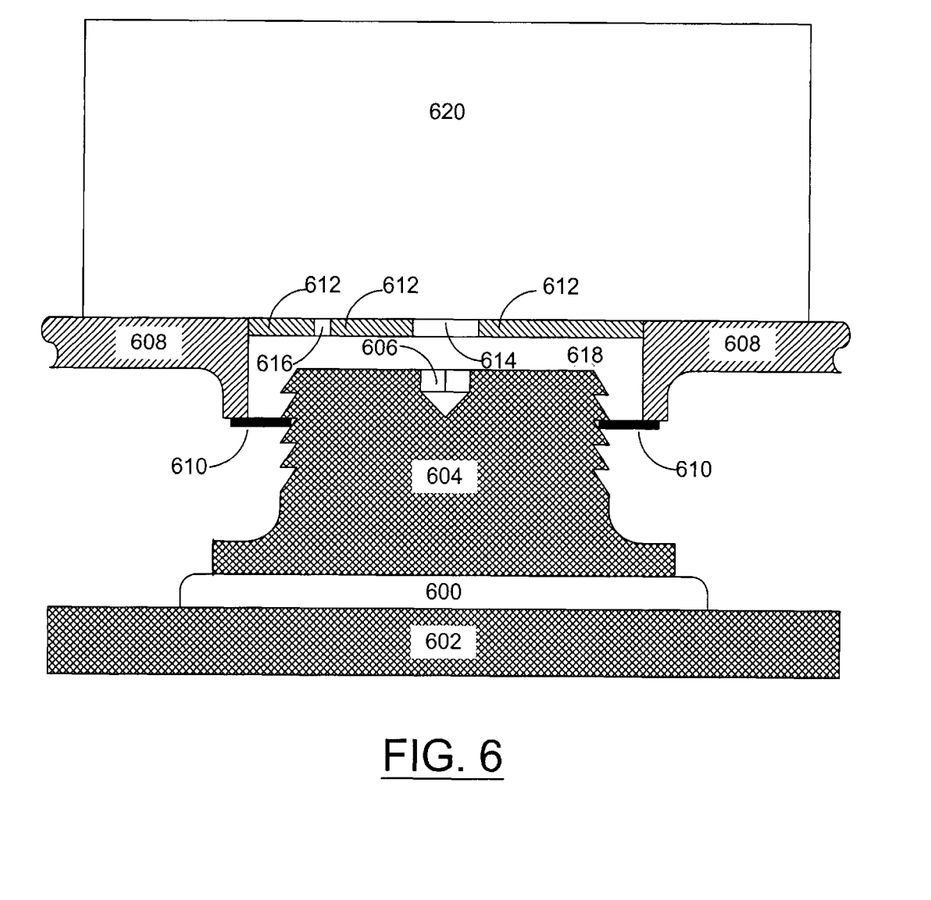
FIG. 6 is a cross-sectional view of an example embodiment of a heat sink according to the present invention.

FIG. 6 is a cross-sectional view of an example embodiment of a heat sink according to the present invention. A heat-generating electronic device 600 is attached to a substrate 602. A thermally conductive toothed pedestal 604 is thermally coupled with the electronic device 600 on a side opposite to that of the substrate 602. Instead of spiral threads, the toothed pedestal 604 has a series of circular saw-tooth cuts about the outside of the pedestal. A heat sink including a heat sink base 608, a plate 612, fins 620 and a thin plate 610 is attached to the push-in pedestal 604. In assembly, the toothed pedestal 604 is simply forced into an appropriately sized opening in the thin plate 610 and the saw-teeth in the surface of the toothed pedestal 604 keep it from backing out of the heat sink. Note that the teeth shown in FIG. 6 are exaggerated in size for purposes of illustration. Many embodiments of the present invention will use teeth proportionally smaller than those shown in this figure. The thin plate 610 is configured to allow the toothed pedestal 604 to fit snugly, but also allow the toothed pedestal 604 to fit into the plate at an angle, allowing for use over heat-generating devices 600 that are not parallel to the thin plate 610. In some embodiments of the present invention the plate 612 may be formed as a contiguous portion of the heat sink base 608, as shown in FIG. 2. Other embodiments of the present invention may construct the plate 612 separately from the heat sink base 608 and physically connect them together to form a surface for the attachment of the heat sink fins 620, as shown in FIG. 6. The plate 612 includes a drive access hole 614 and a solder overflow vent 616. The push-in pedestal 604 includes a drive socket 606.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A heat sink comprising:
a heat sink body, including means for placing liquid solder into a cavity within said heat sink body;
a thin plate mechanically attached to said heat sink body covering said cavity, including means for moveably capturing a pedestal; and
a pedestal, moveably captured within said thin plate.

2. A heat sink as claimed in claim 1,
wherein said pedestal includes threads and is configured to thread into the opening of said thin plate.

3. A heat sink as claimed in claim 1,
wherein said pedestal includes teeth and is configured to push into the opening of said thin plate.

4. A heat sink comprising:
a heat sink body, including means for placing a thermally conductive liquid into a cavity within said heat sink body;
a thin plate mechanically attached to said heat sink body covering said cavity, including means for moveably capturing a pedestal; and
a pedestal, moveably captured within said thin plate.

5. A heat sink as claimed in claim 4,
wherein said pedestal includes threads and is configured to thread into the opening of said thin plate.

6. A heat sink as claimed in claim 4,
wherein said pedestal includes teeth and is configured to push into the opening of said thin plate.

7. A heat sink comprising:
a heat sink body, including a solder cavity;
a thin plate including an opening, mechanically attached to said heat sink body covering said solder cavity; and
a pedestal, inserted into the opening of said thin plate.

8. A heat sink comprising:
a heat sink body, including a cavity;
a thin plate including an opening, mechanically attached to said heat sink body covering said cavity, and a pedestal, inserted into the opening of said thin plate
wherein said pedestal includes teeth and is configured to push into the opening of said thin plate.

9. A heat sink comprising:
a heat sink body, including a cavity;
a thin plate including an opening, mechanically attached to said heat sink body covering said cavity;
a pedestal, inserted into the opening of said thin plate
wherein said pedestal includes a drive socket; and
wherein said heat sink body includes a drive access hole into said cavity, configured to allow access through said heat sink body to the drive socket in said pedestal.

10. A heat sink comprising:
a heat sink body, including a cavity, and including an overflow vent into said cavity;
a thin plate including an opening, mechanically attached to said heat sink body covering said cavity; and
a pedestal, inserted into the opening of said thin plate.

11. A heat sink comprising:
a heat sink body, including a cavity;
a plate mechanically attached to said heat sink body;
a thin plate including an opening, mechanically attached to said heat sink body covering said cavity; and
a pedestal, inserted into the opening of said thin plate.

12. A heat sink as claimed in claim 11,
wherein said cavity is a solder cavity.

13. A heat sink as claimed in claim 11,
wherein said pedestal includes threads and is configured to thread into the opening of said thin plate.

14. A heat sink as claimed in claim 11,
wherein said pedestal includes teeth and is configured to push into the opening of said thin plate.

15. A heat sink as claimed in claim 11,
wherein said pedestal includes a drive socket; and
wherein said plate includes a drive access hole into said cavity, configured to allow access through said plate to the drive socket in said pedestal.

16. A heat sink as claimed in claim 11,
wherein said plate includes an overflow vent into said cavity.

17. A heat sink as claimed in claim 11,
wherein said heat sink body includes heat sink fins.

18. A heat sink as claimed in claim 11, further comprising:
heat sink fins attached to said plate.

19. A method for constructing a heat sink, comprising the steps of:
a) providing a heat sink body including a cavity;
b) creating an overflow vent in said heat sink body into said cavity;
c) attaching a thin plate to said heat sink body under said cavity, wherein said thin plate includes an opening;
d) inserting a pedestal into the opening of said thin plate.

20. A method for constructing a heat sink as claimed in claim 19, further comprising the steps of:
e) adjusting said pedestal to match a height of a electrical device;
f) filling said cavity with molten solder; and
g) mechanically attaching said heat sink to a substrate.

21. A method for constructing a heat sink as claimed in claim 19, further comprising the steps of:
e) adjusting said pedestal to match a height of a electrical device;

f) filling said cavity with a thermally conductive liquid;

g) sealing said thermally conductive liquid inside said cavity; and h) mechanically attaching said heat sink to a substrate.

22. A method for constructing a heat sink as claimed in claim 19, further comprising the step of:

e) attaching heat sink fins to said heat sink body.

23. A method for constructing a heat sink as claimed in claim 19, further comprising the step of:

e) creating a drive access hole in said heat sink body into said cavity; and f) creating a drive socket in a top surface of said pedestal.

24. A method for constructing a heat sink as claimed in claim 19, further comprising the step of:

e) placing a thermally conductive material between said pedestal and the electrical device.

25. A method for constructing a heat sink as claimed in claim 19, wherein said pedestal includes threads and is configured to thread into the opening of said thin plate.

26. A method for constructing a heat sink as claimed in claim 19, wherein said pedestal includes teeth and is configured to push into the opening of said thin plate.

27. A method for constructing a heat sink, comprising the steps of:

a) providing a heat sink body including a cavity;

b) attaching a plate to a top surface of said heat sink body, covering said cavity;

c) creating an overflow vent in said plate into said cavity;

d) attaching a thin plate to said heat sink body under said cavity, wherein said thin plate includes an opening;

e) inserting a pedestal into the opening of said thin plate.

28. A method for constructing a heat sink as claimed in claim 27, further comprising the steps of:

f) adjusting said pedestal to match a height of an electrical device;

g) filling said cavity with molten solder; and h) mechanically attaching said heat sink to a substrate.

29. A method for constructing a heat sink as claimed in claim 27, further comprising the steps of:

f) adjusting said pedestal to match a height of an electrical device;

f) filling said cavity with a thermally conductive liquid;

g) sealing said thermally conductive liquid inside said cavity; and i) mechanically attaching said heat sink to a substrate.

30. A method for constructing a heat sink as claimed in claim 27, further comprising the step of:

f) attaching heat sink fins to said heat sink body.

31. A method for constructing a heat sink as claimed in claim 27, further comprising the step of:

f) attaching heat sink fins to said plate.

32. A method for constructing a heat sink as claimed in claim 27, further comprising the step of:

f) creating a drive access hole in said plate into said cavity; and g) creating a drive socket in a top surface of said pedestal.

33. A method for constructing a heat sink as claimed in claim 27, further comprising the step of:

f) placing a thermally conductive material between said pedestal and the electrical device.

34. A method for constructing a heat sink as claimed in claim 27, wherein said pedestal includes threads and is configured to thread into the opening of said thin plate.

35. A method for constructing a heat sink as claimed in claim 27, wherein said pedestal includes threads and is configured to thread into the opening of said thin plate.

* * * * *